United States Patent [19]
Emken et al.

[11] Patent Number: 5,328,720
[45] Date of Patent: Jul. 12, 1994

[54] COATING-FLUIDIZING GAS SUPPLY SYSTEM AND METHOD FOR FLAT BOTTOM COATER

[75] Inventors: Michael R. Emken; Billie F. Hightower, both of Austin, Tex.

[73] Assignee: Carbon Implants, Inc., Austin, Tex.

[21] Appl. No.: 965,727

[22] Filed: Oct. 23, 1992

[51] Int. Cl.$^5$ ............................................. C23C 16/26
[52] U.S. Cl. ................................... 427/213; 427/249; 118/303; 118/716; 118/DIG. 5; 422/143
[58] Field of Search ............... 427/2, 185, 213, 249, 427/6; 118/303, 716, DIG. 5; 422/143

[56] References Cited

U.S. PATENT DOCUMENTS

| | | | |
|---|---|---|---|
| 2,608,474 | 8/1952 | Gilliam | 422/143 |
| 2,959,537 | 11/1960 | Welty, Jr. | 208/164 |
| 3,398,718 | 8/1968 | Pilloton | 118/48 |
| 3,464,384 | 9/1969 | Miller et al. | 427/213 |
| 3,566,830 | 3/1971 | Flamm | 118/48 |
| 3,636,923 | 1/1972 | McCreary et al. | 118/400 |
| 3,889,631 | 6/1975 | Lackey, Jr. et al. | 118/48 |
| 3,940,514 | 2/1976 | Baker et al. | 427/213 |
| 3,982,900 | 9/1976 | Malgarini et al. | 23/284 |
| 4,080,927 | 3/1978 | Brown | 118/48 |
| 4,098,224 | 7/1978 | Noren et al. | 118/49 |
| 4,221,182 | 9/1980 | Brown | 118/716 |
| 4,271,207 | 6/1981 | Löser et al. | 427/6 |
| 4,288,407 | 9/1981 | Markel et al. | 422/143 |
| 4,335,676 | 6/1982 | Debayeux et al. | 118/303 |
| 4,342,284 | 8/1982 | Löser et al. | 118/716 |
| 4,387,120 | 6/1983 | Barnert | 427/213 |
| 4,478,707 | 10/1984 | Bischoff et al. | 208/157 |
| 4,786,526 | 11/1988 | Arai et al. | 427/213 |
| 4,801,432 | 1/1989 | Galiasso et al. | 422/143 |
| 5,043,145 | 8/1991 | Lietz et al. | 422/143 |
| 5,064,622 | 11/1991 | Cabrera | 422/144 |

FOREIGN PATENT DOCUMENTS

| | | | |
|---|---|---|---|
| 2102438 | 8/1972 | Fed. Rep. of Germany | 427/213 |
| 2626446 | 12/1977 | Fed. Rep. of Germany | 427/6 |
| 718177 | 2/1980 | U.S.S.R. | 118/DIG. 5 |

OTHER PUBLICATIONS

Perry, R. H. and C. H. Chilton, Chemical Engineer's Handbook, 5th ed., McGraw-Hill, New York, 1973, pp. 20-66, 67.

Primary Examiner—Terry J. Owens
Attorney, Agent, or Firm—Fitch, Even, Tabin & Flannery

[57] ABSTRACT

A coating-fluidizing gas supply system for a flat-bottom fluidized bed coater that maintains a high degree of uniform fluidization of levitated particles for a long enough time period to coat medical-device components. The coating-fluidizing gas supply system prevents premature pyrolysis of the coating component of the gas from plugging gas-distributor holes of a flat plate at the bottom of a flat-bottom fluidized bed coater, by directing multiple gas streams uniformly against the entire undersurface of the flat gas-distributor plate, creating an overall cooling-effect on the gas-distributor plate which prevents clogging.

3 Claims, 1 Drawing Sheet

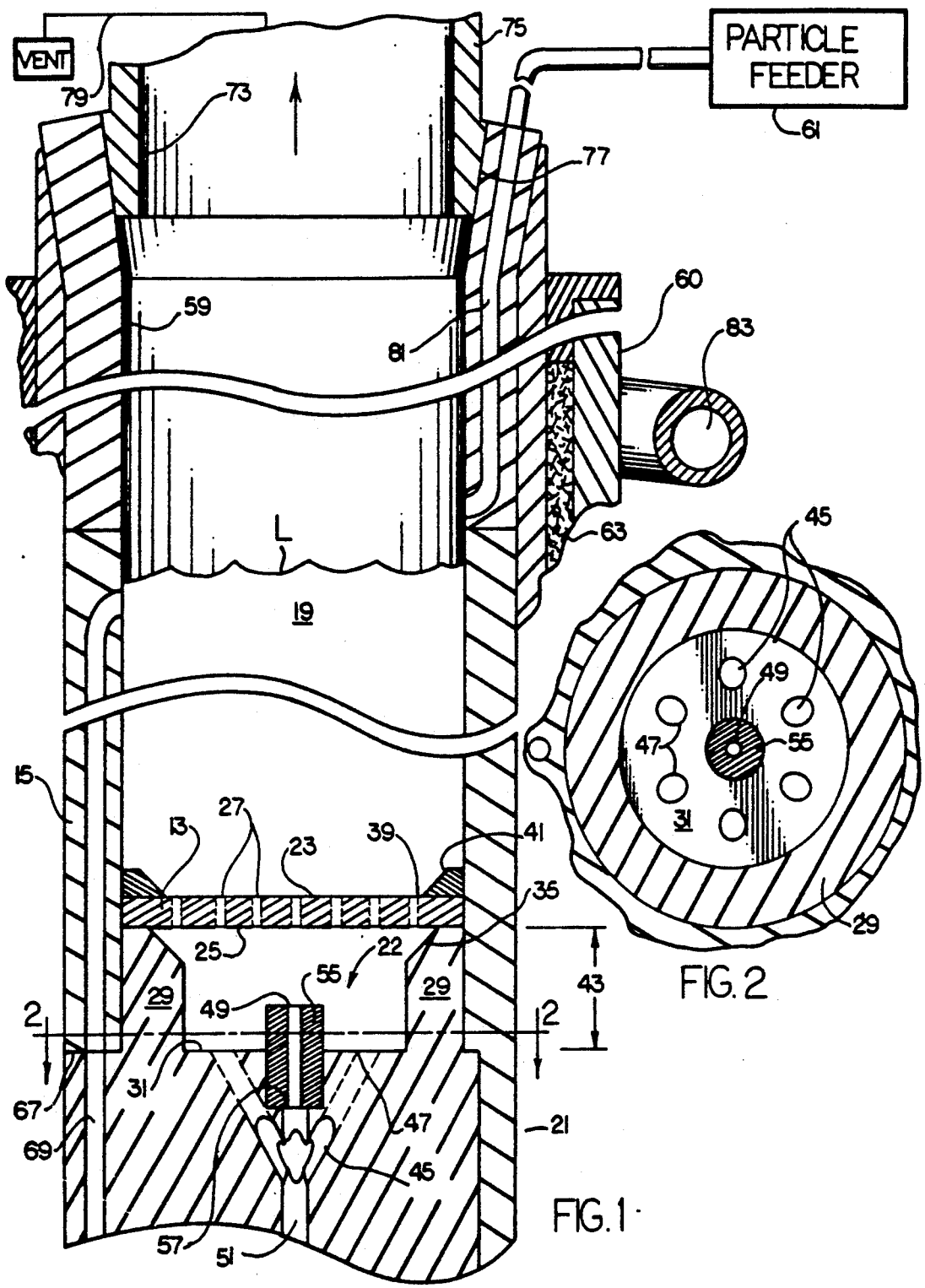

COATING-FLUIDIZING GAS SUPPLY SYSTEM AND METHOD FOR FLAT BOTTOM COATER

The present invention relates generally to pyrolytic carbon deposition in fluidized bed coaters, and more particularly to a system for supplying coating-fluidizing gas to a flat-bottom fluidized bed coater.

BACKGROUND OF THE INVENTION

The process of forming a pyrolytic carbon coating utilizes high-temperature gas-phase dissociation of low-molecular-weight saturated or unsaturated hydrocarbons which undergo polymerization and/or dehydrogenation reactions to ultimately form a finely particulate form of carbon. When this occurs in a fluidized bed of particles in which the hydrocarbon itself, or combined with an inert diluent gas, serves as fluidizing medium, the particles will receive a pyrolytic carbon coating, the nature and quality of which depend on several process parameters including such factors as the nature of the pyrolysis gas, deposition temperature, deposition rate, and uniformity of fluidization. For specific details, reference is made to an article by R. J. Bard et al., "Pyrolytic Carbons Deposited in Fluidized Beds at 1100°–1400° C. from Various Hydrocarbons," *Carbon*, 1968, pp. 603-616. See also, U.S. Pat. Nos. 3,399,969, 3,977,896, 4,546,012, and 4,594,270, all of which are incorporated herein by reference.

There have been many devices proposed for supplying gas in fluidized bed coaters for the purpose of uniformly distributing the fluidizing gas throughout the mass of such beds. Typically, such coating operations have recently been conducted in a relatively small apparatus utilizing a graphite or graphite-lined tube several inches in internal diameter with a lower cone-shaped section which serves as an inlet passage for a fluidizing gas stream that typically contains a decomposable hydrocarbon and an inert gas, such as argon, nitrogen, or helium. While this can be an effective way of uniformly coating with small charges of particles, effectiveness can decrease sharply as the amount of charge increases, causing the employment of larger diameter chambers for larger charges. When this is done, non-uniform fluidization and non-uniform coating can become a severe problem.

The flat-bottom, or flat-bed coater is a device that has the potential of producing a more uniform coating on a medical-device component within a bed of particles, compared to conical-bottom coaters, when viewed on a microscopic scale. It can yield finer silicon (Si) distribution and less banding than does a conical-bottom coater. Flat-bed coaters commonly utilize either porous frits or distributor plates containing a plurality of drilled holes to define the bottom or lower wall of the coating chamber through which both the fluidizing and coating gases enter.

However, one of the major drawbacks of current flat-bed coaters is the tendency of the coating gas component to clog the gas-distributor pores or holes of the distributor plate, thereby modifying the flow of gas upward into the bed and causing less uniform fluidization prior to the completion of the relatively long coating run, which results in coatings of less uniformity. While the distributor plate is not heated directly during the coating process, radiation from the zone of coating and fluidization often heats areas of the plate to a temperature sufficient to pyrolyze the hydrocarbon. More specifically, the temperature at the surface boundary of the gas-distributor plate holes, especially the peripherally outer holes of the plate, becomes sufficiently high enough to decompose the coating components of the coating-fluidizing gas. This often results in clogging of the outer holes of the plate, either by coating-over the top of the hole or by plugging the inside of the hole, which in turn causes the fluidized bed in that area to have less levitation. As a result, the entire bed action can change in a manner which can have an undesirable effect on the material properties of the coating.

Flat-bed coaters used for coating objects useful as components in prostheses or other medical devices require relatively long coating periods and cannot tolerate the distributor plate holes clogging, which affects the uniformity of fluidization. Thus, since the degree of coating uniformity is a direct function of the degree of uniformity of fluidization, it is an object of this invention to provide apparatus for maintaining a high degree of uniform fluidization of levitated particles for a long enough time period to coat medical-device components. This is accomplished by utilizing a coating-fluidizing gas supply system that prevents the coating-over or plugging of gas-distributor holes in a flat plate at the bottom of a flat-bottom fluidized bed coater.

SUMMARY OF THE INVENTION

A coating-fluidizing gas supply system for supplying a fluidized bed reactor with coating-fluidizing gas is created by locating below the gas-distributor plate a particular multi-nozzle injector arrangement for supplying a stream of coating-fluidizing gas. It is disposed at an appropriate distance below said gas-distributor plate and directs impingement of the gas stream uniformly against the entire undersurface of said gas-distributor plate, so that the flow of gas has a cooling-effect across the entire gas-distributor plate, thereby preventing holes in the plate from clogging. A fluidized bed coater apparatus containing the coating-fluidizing gas supply system is particularly useful for coating medical device components with pyrocarbon.

BRIEF DESCRIPTION OF THE DRAWING

FIG. 1 shows a fluidized bed coater having a preferred gas supply system for supplying coating-fluidizing gas to the fluidized bed coater.

DETAILED DESCRIPTION

Unless defined otherwise, all technical and scientific terms used herein have the same meaning as is commonly understood by one of skill in the art to which this invention belongs. All U.S. patents and all publications mentioned herein are incorporated in their entirety by reference thereto.

A preferred gas supply system for supplying a fluidized bed coater with coating-fluidizing gas is shown in FIG. 1 as incorporated into a fluidized bed coater. The gas supply system of the present invention utilizes a flat gas-distributor plate 13 of substantially uniform thickness fitted flush at its periphery against the interior surface at the lower end of a center section tube 15 that constitutes the center section of the coating apparatus, forming an inner compartment of the coater that houses the fluidized bed coating zone 19. The lower region of the center section tube 15 mates with a lower cylindrical section 21 of the coater, that contains a multi-nozzle gas injector arrangement 22. The upper surface 23 of the plate 13 defines the lower wall of a fluidized bed coating zone 19, whereas the lower surface 25 of the plate defines the upper boundary of the gas supply system.

The flat plate 13 has a plurality of vertical holes 27 therethrough, such holes being uniformly distributed in an overall regular pattern, preferably along concentric circles of different diameters. The number of holes 27, in the flat plate of about 2"-6" in diameter, can range from about 10-60, preferably about 20-50, and more preferably about 30-40. The size of the holes in the plate can also vary from about 0.02"-0.2" in diameter, and is preferably about 0.060" in diameter. The flat plate rests on a circular boss 29 protruding from the upper surface 31 of the lower cylindrical section 21 of the coater. The circular boss 29 is beveled 35 on the interior side at an appropriate angle, preferably at an angle between about 20°-70°, more preferably between about 30°-60° and most preferably between about 40°-50° that forms an annular region or pocket of substantially triangular cross section which directs the fluidizing-gas streams through the outer holes 39 of the plate. The plate is secured in place by any fastening means known to one of skill in the art, such as a hold-down ring structure 41 that fits tightly within the center section tube 15 and holds down the top of the plate, or, as described in U.S. Pat. No. 3,889,631, by set screws extending through circumferential holes along the center section tube.

The upper surface 31 of the lower cylindrical section 21, from which multiple streams of coating-fluidizing gas are emitted, is disposed at an appropriate distance 43 below the gas-distributor plate 13. This appropriate distance is preferably about ⅓ the diameter of the flat plate and can range from about ⅛"-6", and it is preferably about 1" when the flat plate diameter is about 3". The injector arrangement 22, located within the lower cylindrical section 21, contains a plurality, preferably six, of circumferentially spaced apart, upward-facing, passageways 45 that terminate in gas outlets or nozzles 47 surrounding a central, vertical nozzle 49. All seven of the nozzles direct impingement flow of the coating-fluidizing gas stream uniformly against the entire undersurface of the gas-distributor plate 13, such that the flowing gas has a cooling-effect on said gas-distributor plate, thereby preventing certain of the holes in the plate from clogging.

The central vertical nozzle 49 extends upwards from a central vertical passageway 51 of the injector arrangement 22 that extends vertically through the lower cylindrical section 21, and is the centerline of the lower cylindrical section which is of circular cross-section, thus, all the coating-fluidizing gas is fed from the single coating-fluidizing gas supply duct 51. The central vertical nozzle 49 is within a cylindrical plug 55 that is received in a cylindrical counterbore or cavity 57 coaxial with the center axis and located at the upper surface 31 of the lower cylindrical section 21. The cylindrical plug 55 extends upward from the upper surface 31 from about ¼-½ the distance separating the under surface 25 of the flat plate 13 and the upper surface 31 of the lower cylindrical section 21. Thus, the central vertical nozzle 49 emits the gas stream from a higher discharge point than the upper surface 31 of the lower cylindrical section 21 wherein the six outlets 47 are formed. The central vertical nozzle 49 has a diameter in the range of about 1/32"-½", more preferably about 1/16"-¼", and most preferably about ⅛".

Each of the circumferentially spaced apart gas passageways 45 is connected at its base or entrance end to the centrally located vertical passageway 51, and thus the coating-fluidizing gas is supplied from the central vertical passageway. Each of the circumferentially spaced apart gas passageways 45 is angled upward and away from the central vertical passageway 51, preferably at an angle between about 20°-70°, more preferably between about 30°-60° and most preferably between about 40°-50° so that the gas streams exiting from the nozzles 47 at the end of the angled passageways 45, hereinafter referred to as angled-passageway-nozzles 47, are substantially directed toward the outer circle or row of holes 39 at the periphery of the gas-distributor plate.

The angled-passageway-nozzles 47 preferably have a diameter of about twice the diameter (±25%) of the central vertical nozzle 49 and can be in the range of about 1/32"-1", more preferably they have diameters of about 1/16"-¾" yet more preferably about ⅛"-¼", and most preferably about ¼". The diameters of the nozzles at the end of the central and angled passageways 47,49 will depend on the quantity of nozzles utilized and the size of the coater. The streams of gas emitted from each outlet-nozzle are accomplished in a fashion to ensure a uniform distribution of the cooling-effect throughout the entire undersurface of the gas-distributor plate 13. It is particularly important that the cooling-effect occurs at least at the outer circle of holes 39 at the periphery of the regular pattern on the gas-distributor plate as there tends to be adequate flow through the interior regions. The cooling-effect is such that the temperature at the surface boundary of each of the gas-distributor holes 27,39 is maintained below the temperature where any substantial decomposition of the coating components of said gas stream occurs.

Although there should be no size limitations on such coaters, of general interest are coaters having tubes not greater than about a foot in diameter and particularly those having an interior diameter of about 6 inches or less. For example, tubes containing an outer diameter of about 4" and an inner diameter of about 3" are contemplated.

The gas supply system of the present invention can be employed in combination with other bed coater components that are well known in the art to produce a fluidized bed coater apparatus. One suitable fluidized bed coating apparatus includes a coating enclosure that contains: a lower cylindrical section 21 wherein the gas injector arrangement 22 is formed, the center tubular section 15 wherein the fluidized bed is formed, and an upper tubular section 59; and these are all suitably supported within an outer structural furnace tube The apparatus also includes other coater components that are well known in the art, such as a particle feeder appropriate insulation 63, a vent, and the like. The lower cylindrical section 21 is about 4"-10" long, preferably about 5"-6" in length, and mates with the bottom end of the center section tubular wall 15 and provides support for the gas distributor plate 13. More specifically, the lower region of the center section tube 15 surrounds the boss 29 protruding from the upper region of the lower cylindrical section 21 of the coater. The center section tube 15 is about 4"-10" long, preferably about 5"-6" in length, and is supported by a ledge 67 at the periphery of the lower cylindrical section. The center tubular section and lower cylindrical section are formed and joined in such a way that independent passageway sections, e.g., to provide a particle removal port 69, are aligned so as to extend through them.

The upper tubular section 59 is about 10"-30" long, preferably about 15"-25" long, and more preferably about 20" in length. The upper tubular section 59 typically provides an upward exit passageway 73 leading from the coating enclosure. An upper insert 75, which can have a frustoconical lower surface 77, serves as a discharge conduit for the upwardly flowing gas stream and extends downward into the upper tubular section 59 and is removable to allow loading of the components to be coated. The hot levitating and coating gases leaving the fluidized bed coater pass through this upper exit passageway 73 and flow via a suitable conduit 79 leading to an appropriate vent. A particle feeding device 61 may be mounted generally above the fluidized bed coater and is designed to feed minute particles into the coating enclosure at a desired rate. The particles from the feeder enter the coater through an entrance conduit 81 which extends downward through the wall of the upper tubular section 59. A suitable induction or alternating current heating device 83 is provided, as is well known in this art, and is disposed in surrounding relationship to the outer structural furnace tube 60 in order to heat the active deposition region of the coating enclosure, together with the small particles and the objects being levitated, to bring them to the desired deposition temperature for coating.

The coating operation is carried out by establishing a levitated bed of minute ancillary particles, submillimeter in size, which is maintained in the lower region of the flat-bottom coating enclosure termed the fluidized bed coating zone 19; this bed is defined by the upper end surface of the gas-distributor plate 13. Once the bed is established, one or more medical-device components to be coated, such as annular valve bodies or occluders for prosthetic heart valves, are appropriately loaded into the bed through the upper exit passageway as by removing the top discharge; once in the bed, they will be levitated among the fluidized ancillary particles by the upwardly flowing gaseous stream provided by the gas supply system. The bed of ancillary particles and the objects to be coated are then appropriately uniformly heated by means well known in the art to raise their temperature to the desired coating temperature by applying an appropriate amount of electrical power to a heating unit. The temperature within the coating enclosure is appropriately monitored and controlled as is well known in this art, using either electrical (e.g. thermocouple) or optical temperature-measuring devices, the latter of which could be effected through a viewing port (not shown).

The upwardly flowing gas stream, during the time of coating, is made up of a mixture of an inert fluidizing gas plus a carbonaceous substance, such as a gaseous hydrocarbon, for example methane, ethane, propane, butane, acetylene, propylene or mixtures thereof, or some other suitable carbon-containing substance that is either gaseous or easily vaporizable, as is well known in this art. The gas is supplied by a gas supply system selected from those well known in the art. If it is desired that the substance being deposited is not 100 percent pyrocarbon but instead is an alloy, for example, of silicon carbide and pyrocarbon, a desired amount of an appropriate source of silicon, such as methyltrichlorosilane, is also included in the fluidizing-coating gas mixture. A source of hydrocarbon is provided with a flow-regulating valve arrangement alongside a source of inert gas, for example argon, helium or nitrogen which is likewise equipped with a suitable flow-regulating valve arrangement. Gases from these two sources flow into a common line which leads to the vertical passageway 51 of the gas supply system.

The total flow of the coating-fluidizing gas upward through the coating enclosure is regulated so that the fluidized bed occupies a region generally filling the lower portion of the tube 19 and extending upward to the line L.

For coating medical device components the ancillary particles which make up the fluidized bed, are chosen so as to have a density greater than the density of the substance being deposited in the bed. When pyrocarbon is to be deposited, or pyrocarbon alloyed with a minor amount of silicon carbide, ancillary particles of materials having a density of at least about 1 gram/cm$^3$, and preferably from about 2 to about 5.5 gm/cm$^3$, are used. Examples include refractory oxides, such as alumina, alumina-silica (e.g. mullite) and dense zirconium oxide, e.g. $ZrO_2$ having a density greater than about 2 grams per cm$^3$ and mullite of a density of about 3.2 gm. per cm$^3$. As these ancillary particles are coated, the overall density of the composite or coated particles will gradually become less as they increase in size. In general, the smaller uncoated particles tend to sink to the lower portion of the bed, while the less dense composite particles having a greater thickness of coating are generally levitated higher and reside in the upper portion of the bed. The particles employed should be about 1,000 microns or less in size. Particles are added and withdrawn throughout the entire coating run so that the components being coated are surrounded by a substantially constant fluidized bed, i.e., having the same approximate overall surface area. Particles added during the coating run should have an average size not greater than about 400 microns and may be made up of particles between 300 and 425 microns, and the average size of the particles withdrawn should be at least about 500 μm.

Should a distributor plate become clogged, the fluidized bed often will no longer exhibit uniform fluidization and no longer properly levitate the objects being coated, and there is danger that the entire bed will collapse, interrupting the coating process and likely resulting in a rejection of the objects being coated from the standpoint of quality control. By employing the gas supply system of the present invention, such a collapse of a fluidized bed can be positively prevented because the temperature at the surface boundary of each of the gas-distributor holes is below the temperature where any substantial decomposition of the coating components of said gas stream occurs, thereby preventing the clogging of the distributor-holes.

As an example of operation of a fluidized bed coating apparatus embodying various features of the invention, a fluidizing flow of an inert gas, such as nitrogen, is established upward through the coater by opening a valve and setting it to supply nitrogen from a suitable source, which may be a pressurized tank or the like. A suitable charge of particles is then added to the coater, through the upper end, to create a fluidized bed. For example, in a coater having an internal coating enclosure diameter of about 3½ inches, one may begin with a charge of about 250 to 500 grams of pyrocarbon-coated zirconium dioxide particles having sizes greater than about 325 microns but less than about 850 microns. The particles of this initial bed are pyrocarbon-coated versions of the uncoated zirconia particles that will subsequently be fed into the bed during coating, having a density of about 2.2 grams per cc and a size ranging from about 300 microns to about 425 microns (with an average size of about 360 microns), which uncoated particles are loaded into the particle feeder. For a typical coating operation in a coater of about this size, about 20 to 40 orifice rings are added to the bed; such rings, when coated, will serve as valve bodies for prosthetic heart valves. Exemplary orifice rings generally have the form of short tubes, having a height of about 0.7 cm., an I.D. of about 1.5 to 2.5 cm. and an O.D. of about 1.6 to 2.6 cm.

The apparatus is then brought up to its operating temperature of between about 1,200 and 2,000° C. so as to uniformly heat the particles and the objects to a desired temperature using the induction heating apparatus 83. Typically, the temperature is maintained at about 1,320° C. The bed itself occupies a volume of about 17 cubic inches within this coating enclosure.

When coating is ready to begin, a valve is opened, and flow of a suitable coating gas, such as propane, is added to the fluidizing gas that is already flowing through the central passageway 51. In order to provide some alloying of the pyrocarbon being deposited with silicon carbide, methyltrichlorosilane is preferably added to the gas stream as is well known in this art. The flow rate of the inert gas is adjusted, if needed, so that the flow of the fluidizing-coating gas mixture upward through the coating enclosure and out through an appropriate gas outlet, measured at standard temperature and pressure, is about 13 liters per minute nitrogen, about 7 liters per minute propane and about 7 grams per minute methyltrichlorosilane.

At the conclusion of coating and cool-down, the coated articles are examined and the SiC-alloyed pyrocarbon is found to be of high quality and to have a uniform thickness of about 0.010 inch.

Very generally, methods and apparatus are provided which allow the very precise control of the deposition of a substance, such as pyrocarbon, onto a substrate being levitated in a fluidized bed of particles. The apparatus is useful for providing a coating that has uniform material properties throughout the thickness of the deposit. Through the mechanism of supplying coating-fluidizing gas in such a manner that provides an adequate cooling-effect to the distributor plate 13, so that regions defining the gas-distributor holes, especially the outer holes, will not reach temperatures that will decompose the coating component of the coating-fluidizing gas and thus are maintained free of clogging during the entire coating process. This results in a high uniformity of fluidization within the fluidized bed over coating runs measured in hours and excellent quality of coatings.

Although the invention has been described with regard to certain preferred embodiments, it should be understood that various changes and modifications as would be obvious to one having the ordinary skill in this art can be made without departing from the scope of the invention which is defined solely by the claims appended hereto.

Particular features of the invention are emphasized in the claims which follow.

We claim:

1. A fluidized bed coater apparatus comprising a fluidized bed coating chamber having the shape of a circular cylinder, means for supplying particles to said coating chamber, means for removing particles from said coating chamber, and a coating-fluidizing gas supply system for supplying said fluidized bed coater with coating-fluidizing gas, which supply system includes:

a circular gas-distributor plate defining a lower wall of said fluidized bed coating chamber and having a plurality of holes therethrough, said gas-distributor plate being flat and of substantially uniform thickness, and said plurality of holes being vertical, of a diameter not greater than about 0.2 inch, and uniformly distributed in an overall regular pattern across said plate, and supply means for directing multiple streams of coating-fluidizing gas against the undersurface of said circular plate, said supply means containing a single inlet duct for carrying all of the coating-fluidizing gas mixture for said coating chamber, an injection chamber located below said circular plate, and an injector arrangement that is located at the bottom of said injection chamber and spaced a distance below said gas-distributor plate so as to direct impingement of said multiple streams of gas substantially uniformly against the entire undersurface of said gas-distributor plate, said injector arrangement containing a plurality of circumferentially spaced apart gas outlet-nozzles which are individually oriented at angles to the vertical and surround a central vertical nozzle, whereby said outlet-nozzles direct multiple streams of said gas against said undersurface so that said gas has a cooling effect on said gas-distributor plate and on the surface boundary of each of said holes, thereby preventing said holes in said plate from clogging.

2. The apparatus of claim 1 wherein said circular gas-distributor plate is spaced above said injector arrangement a distance equal to about one-third of the diameter of said circular plate, and wherein said angled nozzles have diameters about twice the diameter of said central vertical nozzle.

3. A method of coating an object with pyrolytic carbon in a fluidized bed of minute particles, which method comprises providing a generally circular cylindrical coating zone, providing a generally circular porous plate at the bottom of said coating zone, said plate having a plurality of spaced apart straight holes extending vertically therethrough which have diameters not greater than about 0.2 inch, supplying said zone with a bed of minute particles and at least one object to be coated with pyrocarbon, providing a gas injection chamber below said circular plate;

supplying a coating-fluidizing gas mixture to said injection chamber which gas mixture contains a hydrocarbon component and an inert gas component, and dividing said gas mixture supply at a location near the bottom of said injection chamber and directing a central vertical stream and a plurality of circumferentially uniformly spaced apart individual angular streams of said coating-fluidizing gas mixture from nozzles within said injection chamber to impinge substantially uniformly across the area of the undersurface of said circular plate, which angular streams surround and are spaced equal radial distances from said central vertical stream and are each oriented at an angle of between about 30° and about 60° to the vertical, said nozzles being located a selected distance below said plate so that said gas mixture has a cooling effect upon the surfaces of said plate including the surface boundaries of said holes while flowing upward through said straight vertical holes thereby maintaining said plate surfaces at a temperature below the temperature where substantial decomposition of said hydrocarbon component occurs to prevent clogging of said vertical holes with pyrocarbon and assure that coating of said object with pyrocarbon proceeds uniformly over an operating period of longer than about one hour.

* * * * *